United States Patent [19]

Takeno et al.

[11] Patent Number: 5,767,521
[45] Date of Patent: Jun. 16, 1998

[54] ELECTRON-BEAM LITHOGRAPHY SYSTEM AND METHOD FOR DRAWING NANOMETER-ORDER PATTERN

[75] Inventors: Shiro Takeno; Shigeru Kanbayashi; Mitsuo Koike, all of Kanagawa-ken; Seizo Doi; Iwao Higashikawa, both of Tokyo, all of Japan

[73] Assignee: Kabushiki Kaisha Toshiba, Kawasaki, Japan

[21] Appl. No.: 528,409

[22] Filed: Sep. 14, 1995

[30] Foreign Application Priority Data

Sep. 16, 1994 [JP] Japan ................. 6-222254
Sep. 11, 1995 [JP] Japan ................. 7-232157

[51] Int. Cl.[6] ........................................ H01J 37/04
[52] U.S. Cl. ........................... 250/492.2; 250/398
[58] Field of Search ................ 250/492.2, 492.22, 250/492.23, 398, 396 R, 311, 306, 307

[56] References Cited

U.S. PATENT DOCUMENTS

| | | | |
|---|---|---|---|
| 3,847,689 | 11/1974 | Fletcher et al. | 250/311 |
| 3,996,468 | 12/1976 | Fletcher et al. | 250/396 R |
| 4,376,891 | 3/1983 | Rauscher et al. | 250/311 |
| 5,229,320 | 7/1993 | Ugajin | 250/492.2 |
| 5,260,151 | 11/1993 | Berger et al. | 430/5 |
| 5,446,589 | 8/1995 | Ru et al. | 250/307 |

FOREIGN PATENT DOCUMENTS 5-251317  9/1993  Japan.

OTHER PUBLICATIONS

Hirsch et al., "Periodic and Ordered Structures", *Electron Microscopy of Thin Crystals*, Chap. 15, pp. 357–365 (1965).

*Primary Examiner*—Kiet T. Nguyen
*Attorney, Agent, or Firm*—Foley & Lardner

[57] ABSTRACT

An electron-beam lithography system employing an "electron holography" technique is disclosed. The system at least comprises: a shaping aperture for shaping an electron beam emitted from an electron-beam source so as to have a specific beam shape; at least two single crystal thin films for diffracting the electron beam passed through this shaping aperture; focusing means for respectively focusing the incident electron beam passed through these single crystal thin films and the diffracted electron beams diffracted by these single crystal thin films; and a select aperture for selecting only the desired diffracted electron beams. The transmitted incident electron beam interferes with the diffracted electron beams, whereby a stripe pattern having a desired nanometer-order pitch is formed on a resist surface coated onto a semiconductor substrate or a mask blank.

22 Claims, 5 Drawing Sheets

ELECTRON-BEAM LITHOGRAPHY SYSTEM AND METHOD FOR DRAWING NANOMETER-ORDER PATTERN

BACKGROUND OF THE INVENTION

1. Field of the Invention

The present invention relates to an electron-beam lithography system and an electron-beam drawing method, and more specifically to an electron-beam lithography system and an electron-beam drawing method for forming a nanometer-order pattern by making use of an interference effect exerted on an electron-beam wave.

2. Description of the Prior Art

The growth of microelectronics during the last 25 years, from the first successful large-scale integration (LSI) of microprocessor and memory chips to the present ultra large-scale integration (ULSI), has been truly spectacular. The key to this growth has been the drive to much smaller dimensions using the lithographic technology. As hearing an announcement of 1 Gb DRAM employing 0.16 μm technology, it is said that demanded design rules are rushed from a sub-half-micrometer region into a sub-quarter-micrometer region, and the design rules of 70 nm are required in 16 Gb DRAM. Accordingly, lithography technology for forming LSI patterns is also making rapid progress, however in order to cope with requirements for such minuteness from the deep submicrometer region to the nanometer-order region, a technological breakthrough is required. In the lithography technology, an optical lithography, an X-ray lithography, an electron-beam lithography and the like exist as the previous-invented techniques.

In the optical lithography which images patterns contained on a mask onto a wafer making use of light, the predominant system for IC manufacturing technology is a stepper that applies a pattern on wafers by repeating an image across the wafer's surface, making use of a so-called reduction printing system, in which the image is demagnified on projection. Generally, a minimum resolvable feature size, or a resolution R of an optical lithography is $$R = \beta \lambda / NA \quad (1)$$

(where β is a constant of proportionality, or a process prefactor; λ is a wavelength of a light source of an exposure system; and NA is a numerical aperture of a lens used.) According to this formula (1), it is understood that a shorter wavelength is required to obtain the higher resolution. However, even if deep-UV light beams from an excimer laser etc. are used in a current stage, the minimum feature size of about 200 nm may be a limitation.

Furthermore, since there are no suitable focusing lenses for X-rays, X-ray lithography has an inherent disadvantage of 1:1 masks, which means that patterns on the masks must be the same as the image, it is difficult to manufacture and repair a mask, a minimum feature size of 100 nm or less cannot be obtained.

On the other hand, in electron-beam lithography using electron-beams, the electron-beams focused by an electronic lens are scanned by a deflector, whereby pattern tracing is performed. However, in a drawing method using conventional electron-beams, the exposure is performed by handling an electron as a particle. Since a beam diameter is generally set to be ¼ or less of the minimum line width of patterns and also there are some problems such as "a proximity effect", resulting from backscattered electrons from the substrate, a minimum resolution finer than the beam diameter, or the minimum resolution of 100 nm or less, cannot be obtained. Furthermore, there are some problems in the electron-beam lithography that a so-called substrate throughput is lower.

As described above, even in any lithographies such as the conventional optical lithography, the X-ray lithography, and the electron-beam lithography, it is difficult to obtain the minimum resolution of 100 nm or less, and this causes a large barrier in manufacturing semiconductor devices having finer and finer geometries.

As described above, the fabrication of semiconductor devices such as gigabit DRAM requires nano-fabrication techniques. However, not only an integrated circuit but also a discrete device requires similar atomic-scale features. For example, a transistor of terahertz band operations designed by quantum mechanics requires a smaller dimension than an electron mean free path. In manufacturing a quantum microstructure and semiconductor quantum wave device having such a mesoscopic (±10 nm) scale, miniaturization in the one-dimensional direction, namely in the thickness direction, can be coped with by a laminating technique, or an ultrathin multi-layer fabrication technique such as Molecular Beam Epitaxy (MBE), Atomic Layer Epitaxy (ALB), or Molecular Layer Epitaxy (MLE). However, in manufacturing a so-called quantum wire or a so-called quantum box in the two-dimensional or three-dimensional manner, plane patterns on a nanometer scale, or a mesoscopic scale are required.

SUMMARY OF THE INVENTION

It is an object of this invention to provide an electron-beam lithography system and an electron-beam drawing method capable of obtaining stripe patterns having a so-called mesoscopic scale, or a nanometer-order dimension close to an atomic size at a desired pitch.

Furthermore, it is an object of this invention to provide an electron-beam lithography system and an electron-beam drawing method capable of obtaining stripe patterns having a nanometer-order pitch within a beam-exposed region having a specific shape, of changing freely the pitch of patterns, and further of changing freely the direction of the patterns. The beam-exposed region is called "excel".

In order to achieve the above-mentioned objects, the electron-beam lithography system according to the present invention comprises: a shaping aperture 102 for making a first electron beam emitted from an electron-beam source a specific beam shape as shown in FIG. 1; at least two single crystal thin films 2a, 2b for receiving the first electron beam adjusted so as to be this specific shape; focusing means 3 such as an electron lens etc. for focusing a first electron beam transmitted through the single crystal thin films without being diffracted, and a second electron beam produced by diffraction by the single crystal thin films; and selecting means 4 such as a select aperture or an objective lens-aperture etc. for selecting only a desired electron beam out of the first electron beam or the diffracted electron beam. Next, interference fringe patterns formed by the transmitted electron beam (the first electron beam) and diffracted electron beams (the second electron beams) that transmit the focusing means 3 and mutually interfere with are exposed to a surface of electron beam resist-coated on a surface of a substrate 5 held on a substrate pedestal mounted on a specific X-Y and O stage etc., whereby nanometer-order patterns can be drawn. The substrate may be a mask blank or the semiconductor wafer for direct writing.

Furthermore, in the electron-beam drawing method according to the present invention, the first electron beam is irradiated to at least the two single crystal thin films, and the first electron beam transmitting these single crystal thin films and the second electron beams produced by the diffraction with these single crystal thin films of the first electron beam are focused, and patterns produced due to the mutual interference of these transmitted (the first) and diffracted (the second) electron beams are drawn.

The present invention uses the wave nature of the electron beam and makes use of a holographic interference effect. In this constitution and method, when the coherent electron beam (electron wave) emitted from the electron beam source passes through at least the two single crystal thin films 2a, 2b acting as an electron biprism as shown in FIG. 1, the electron beam is diffracted by a crystal lattice plane constituting these single crystal thin films, forming two diffracted electron waves or more, namely diffracted waves. The transmitted wave and these diffracted waves are focused on a back focal plane by the focusing means, for example, an electron lens. After this focusing, the transmitted electron wave and diffracted electron waves mutually interfere with or "beat", and fringe patterns having a systematic period are formed and exposed on an image plane such as resist etc. as it is, whereby the fine nanometer-order patterns can be drawn.

Here, when a distance between the single crystal thin films 2b and the electron lens 3 is x and a distance between the electron lens 3 and a surface of the substrate, or workpiece 5 is y as shown in FIG. 1, an obtained pattern magnifying power M is represented as $$M = y/x \quad (2)$$

In the case where, for example, two single crystal thin films are used, when respective interplanar spacing of single crystal thin films are $d1$, $d2$ and a relative rotational angle of the two single crystal thin films is $\theta$, a pitch of the emerged fringe pattern, namely a spacing D, is $$D = Md1\ d2/\sqrt{(d1^2 + d2^2 - 2d1\ d2 \cdot \cos\theta)} \quad (3)$$

As is understood from the formula (3), in order to obtain a desired spacing D having a predetermined lattice spacing $d1$ and $d2$ can be freely selected. A magnifying power M and an angle $\theta$ between the two single crystal thin films can also be selected to obtain the desired spacing D.

Furthermore, in order to sharpen the obtained image, a focal distance f of the electron lens preferably satisfies $$1/f = 1/x + 1/y \quad (4)$$

However, a value y, when the value of f and x are established, may have a deviation of about 0.5% from the value y obtained by the formula (4). In the case where a suitable single crystal thin film is used, a normal electron lens having f of several-mm is used, and further the value of y/x, namely a value M, is about 10, a value D can be set to be a several-nanometer-order value, the fringe pattern having a mesoscopic scale spacing can be exposed on a resist coated on the substrate 5.

Here, as represented by the formula (3), since the parameters deciding the spacing (pitch) D of fringe patterns do not include an acceleration voltage of electron beams, even if a change in the acceleration voltage of electron beams occurs, a drawing position does not move and therefore stable drawing can be achieved.

Furthermore, it is desirable that the electron-beam lithography system of the present invention further comprises first deflecting means 11, for example a deflecting coil, for deflecting the first electron beam emitted from the electron-beam source to the focusing means 3, provided between the electron-beam source and the focusing means 3, as shown in FIG. 5. By this first deflecting means 11, it is possible to readily shift the first electron beam emitted from the electron-beam source to the focusing means 3 towards a center of an optical axis of the focusing means 3 (electron lens). Thus, it is possible to reduce an influence of an aberration of the focusing means 3 (electron lens) and to enhance image quality of patterns on the image plane.

Furthermore, it is preferable that the electron-beam lithography system of the present invention further comprises focusing means 12 such as an objective lens etc. for focusing the first and second electron beams to interfere each other so that the electron beams are directed to the image plane to form an image, provided between the focusing means 3 and the substrate 5, as shown in FIG. 5.

In this case, the spacing D of fringe patterns is $$D = M1\ M2\ d1\ d2/\sqrt{(d1^2 + d2^2 - 2d1\ d2 \cdot \cos\theta)} \quad (5)$$

instead of the formula (3), wherein M1 is a magnifying power of the electron lens (first focusing means) and M2 is a magnifying power of the objective lens (second focusing means).

As represented by this formula, the magnifying power of the second focusing means is changed, whereby it is possible to freely change the spacing (pitch) D of fringe patterns to increase the degree of freedom in selecting the pitch D.

Furthermore, it is desirable that the electron-beam lithography system of the present invention further comprises second deflecting means 13 such as a deflecting coil etc. for deflecting electron beams directing from the second focusing means 12 to the image plane 5, provided between the second focusing means 12 and image plane 5, as shown in FIG. 5. By this second deflecting means 13, it is possible to deflect the electron beams directing from the second focusing means to the image plane and to collectively and freely change a position of patterns on the image plane.

Other and further objects and features of the present invention will become obvious upon an understanding of the illustrative embodiments about to be described in connection with the accompanying drawings, or will be indicated in the appended claims, and various advantages not referred to herein will occur to one skilled in the art upon employing of the invention in practice.

DETAILED DESCRIPTION OF THE EMBODIMENTS

Figure 1:
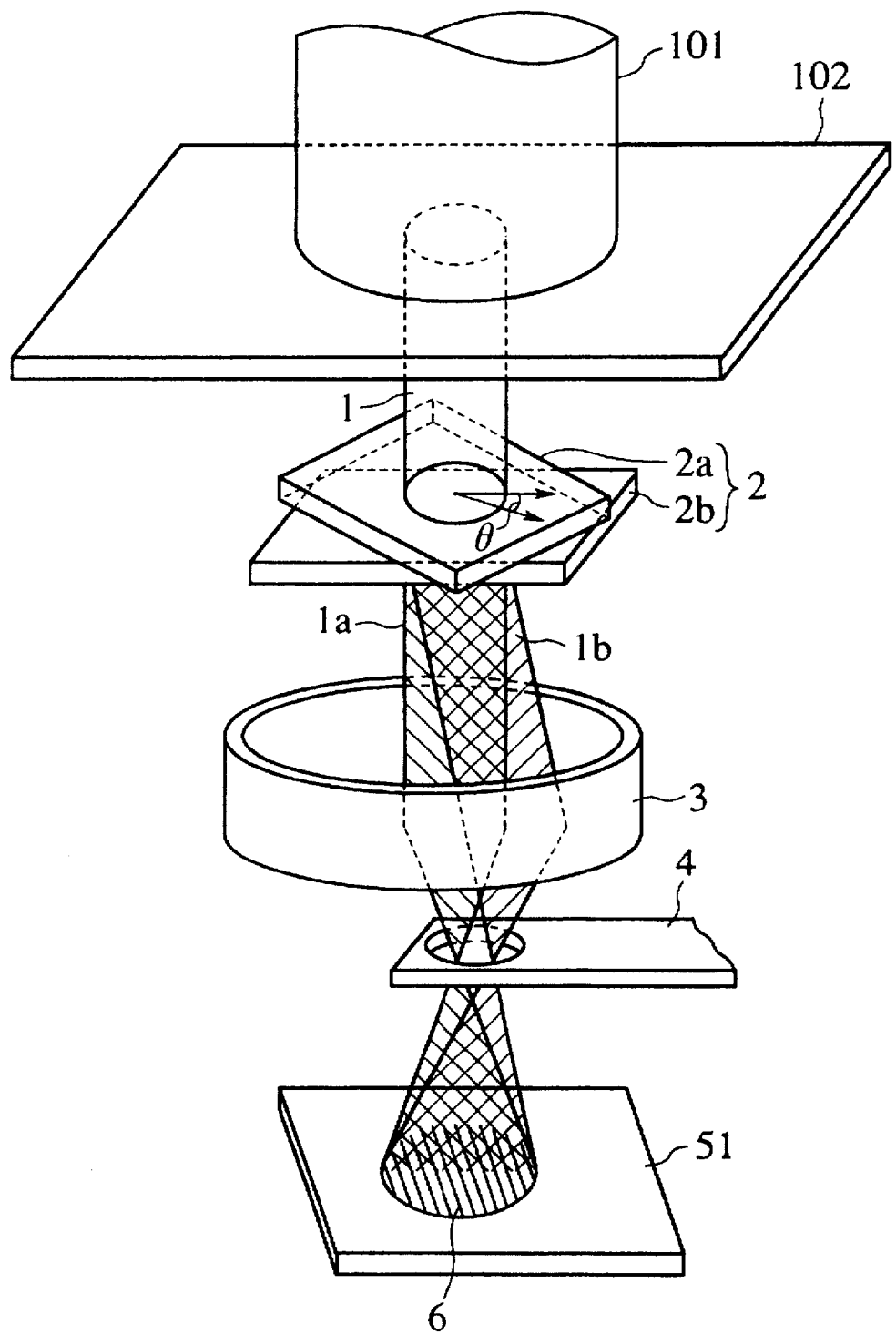
FIG. 1 is a typical view showing a schematic constitution of an electron-beam lithography system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a schematic view showing the main portion of an electron-beam lithography system according to a first embodiment of the present invention. The electron-beam lithography systems are classified into a Gaussian beam configuration, in which the electron beam from a crossover of an electron gun is projected onto image plane through an electron optics system; and a shaped beam configuration, in which the shaped beam through a rectangular or circular shaping aperture is reduction-projected on the image plane by an electron optics system. The shaped beam configuration, or the shaped beam machines are further classified into a fixed shaped beam machine using a single aperture image; and a variable shaped beam machine using the two shaping apertures and controlling the projected position of the shaped beam from a first aperture on to a second aperture by an electron beam deflection so that a beam dimension can be changed. FIG. 1 is an embodiment of a fixed shaped beam electron-beam lithography system using a circular shaping aperture 102. This embodiment can also be applied to a variable shaped beam machine and this can readily be understood from the below-explained technique idea.

Figure 2A:
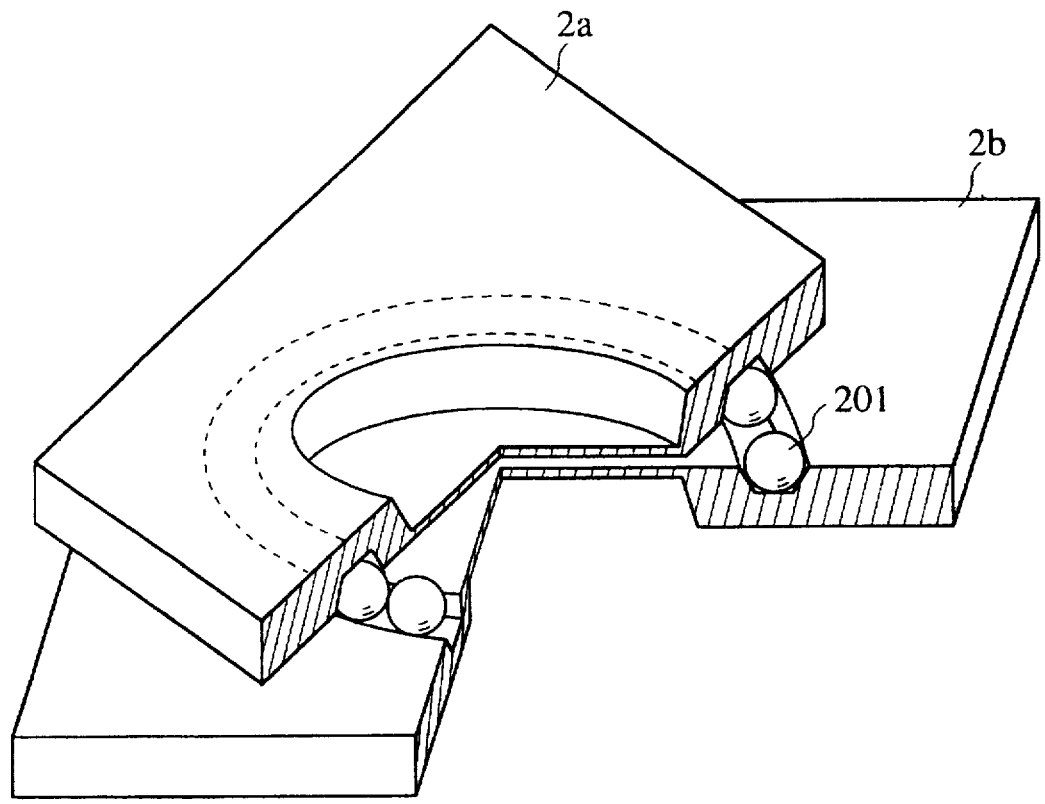
FIGS. 2A and 2B are typical views showing a specific constitution of two single crystal thin films as an electron biprism.
Figure 2B:
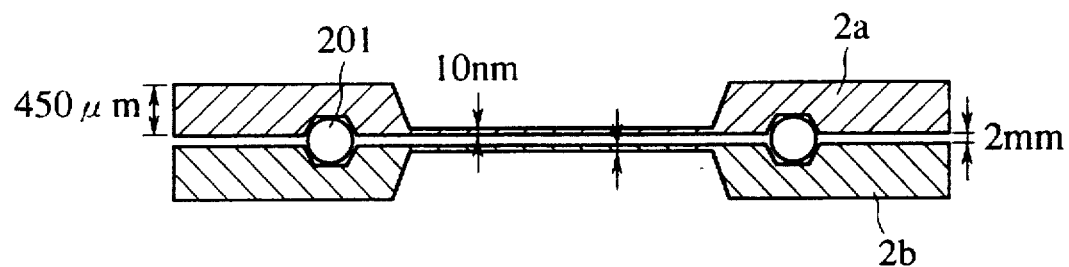
Figure 3:
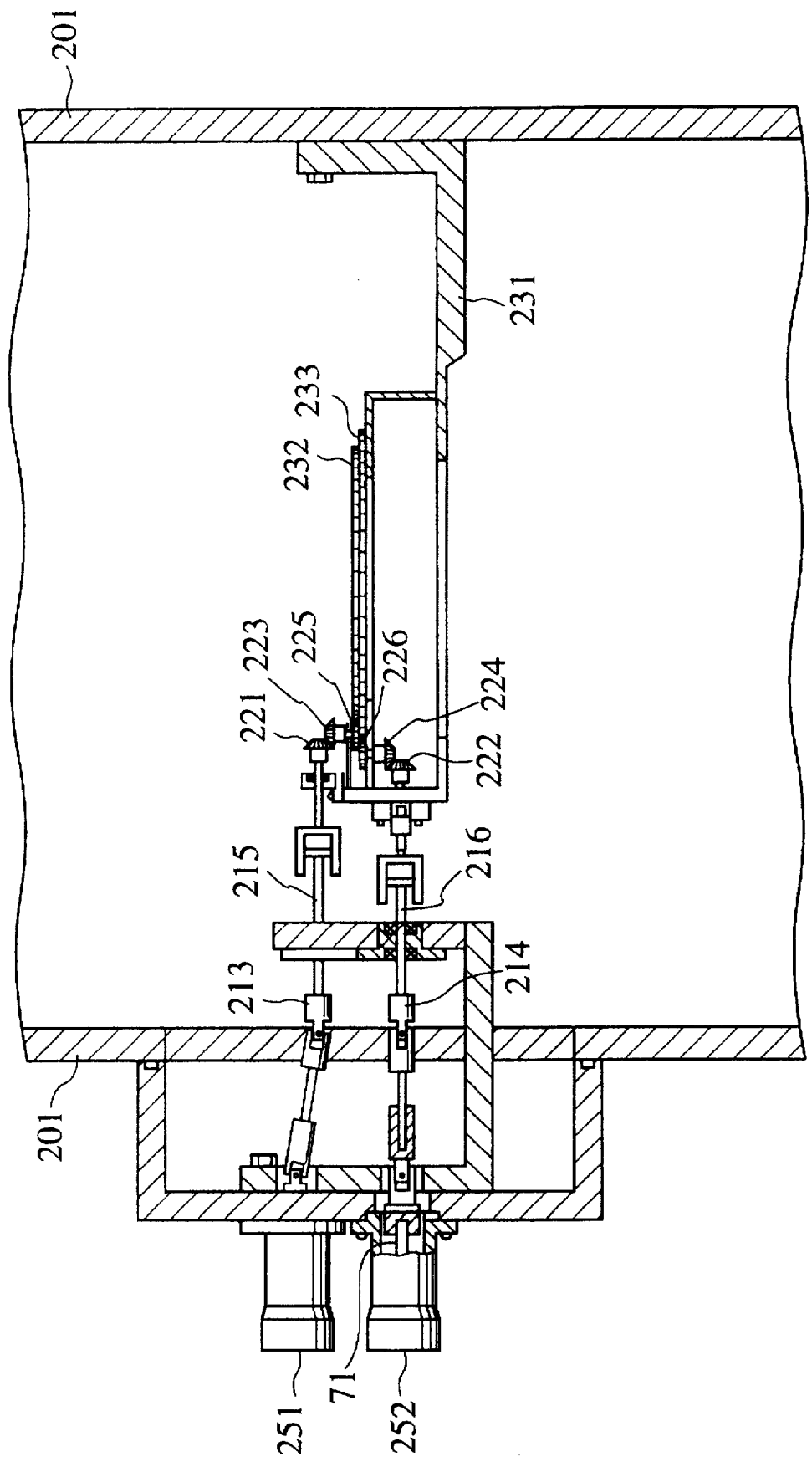
FIG. 3 is a view for explaining a mechanism of independently or integrally rotating the two single crystal thin films about a center axis of electron beams, respectively.

As shown in FIG. 1, the electron-beam lithography system according to the first embodiment of the present invention comprises an electron-beam source (not shown) to emit an electron beam 101; a shaping aperture 102 having a circular hole to shape the electron beam 101 so as to be circular; two single crystal thin films 2a, 2b; an electron lens 3; and a select aperture 4. Further, in FIG. 1, a workpiece 5 such as a mask substrate (reticle substrate) etc. on which an electron-beam resist such as polymethylmethacrylate (PMMA) etc. is coated and is mounted on a substrate on a substrate pedestal 51. In the case of the direct writing, a Si wafer or a GaAs wafer on which resist is spin-coated may be used as the workpiece 5. Here, the electron lens 3 is used as the focusing means for focusing electron beams. Further, the select aperture 4 transmits only optional electron beams out of the electron beams focused by the electron lens 3 and is used as a selecting transmission means for preventing other electron beams from passing therethrough. Further, as shown in FIGS. 2A and 2B, and FIG. 3, a mechanism for rotating independently or integrally the respective thin films 2a, 2b about the optical axis 7 of the electron beams emitted from the electron-beam source is provided.

A thermal electron emission type filament such as single crystal lanthanum hexaboride (LaB) etc. is used as the electron-beam source. In the case where an electron-beam resist with high resolution and low sensitivity is used, it is effective that a field-emission type electron gun is also used. The field-emission type electron gun can produce electrons in very bright, fairly coherent beams. Further, as for the single crystal thin films 2a, 2b, it is essential to select single crystal so that a spacing D of fringe patterns 6 can be determined as a nanometer-order spacing, namely a single crystal capable of realizing a suitable combination of d1, d2 (face intervals (crystal lattice spacings) of each of the thin films 2a, 2b) in the formula (3), or a single crystal having high diffracted beam intensity from lattice planes corresponding to d1, d2. For instance, a single crystal of Si (110) may be selected. This single crystal of Si (110) causes diffracted waves corresponding to d1=d2 =0.314 nm of the interplanar spacing of a Si (111) plane. The diffracted waves from the Si (111) face have high beam intensities.

Furthermore, as for the thickness of Si (110) face single crystal substrates 2a, 2b (hereinafter, called Si substrates), the Si substrates are preferably as thin as possible so that it is easy to transmit the electron beams. Accordingly, in the first embodiment of the present invention, a 300 to 600 μm thick Si substrate, in which only a center portion through which the electron beams pass is etched to have a thickness of about 10 nm, is employed as shown in FIG. 2B. A peripheral portion is thick to hold mechanical strength and its typical thickness may be 450 μm as shown in FIG. 2B. Relating to the thickness of the Si substrates 2a, 2b, the electron-beam source is selected that an acceleration voltage is about 100 kV, and to have a current density on the Si substrate 2a of about 10A/cm². Further, the gap between the Si substrates 2a and 2b is as narrows as possible and the Si substrates 2a, 2b are arranged so that a relative rotational angle θ between them can be 60°.

Furthermore, the electron lens 3 is arranged so that the distance x between the lithography lens 3 and the Si substrate 2b is equal to 2 mm, and also it is arranged so that the distance y between an exposure plane (image plane) at the electron-beam resist coated on a surface of the workpiece (or substrate) 5 and the electron lens 3 is equal to 20 mm. That is, a magnifying power M of patterns obtained according to the formula (2) is selected to be about 10. In this case, a focal distance f of the electronic lens 3 is equal to 20/11 mm according to the formula (3).

In this connection, as shown in FIGS. 2A and 2B, the center portions of the Si substrates 2a, 2b are etched to be thinly 10 nm respectively, and to have ball bearing grooves that are formed in peripheral thick portions and cut out circularly. Spheres 201 made of stainless steel having a diameter 2.5 mm are incorporated into these ball bearing grooves, and can rotate mutually at the distance 2 mm. The Si substrates 2a, 2b are respectively supported by turn tables 232, 233 having the teeth of gear wheels cut out in their periphery as shown in FIG. 3, and these turn tables, or toothed wheels 232, 233 can be rotated by an external unit of a vacuum chamber via rotary motion feedthroughs 251, 252 fitted onto an external wall 201 of a vacuum chamber, or a lens-barrel of the electron-beam lithography system. The rotary motion feedthroughs 251, 252 are coupled to bevel gears 221, 222 via universal joints 213, 214 and connecting shafts 215, 216. The bevel gears 221, 222 engaged with the bevel gears 223, 224 are coupled to small spur gears 225, 226, engaged with the toothed wheels 232, 233. The rotary motion feedthroughs 251, 252 for the rotation of Si substrates 2a, 2b are respectively independently provided as shown in FIG. 3, whereby the two Si substrates 2a, 2b can respectively independently or integrally rotate about an optical axis of electron beams emitted from the electron-beam source. By rotating means of the Si substrates 2a, 2b as shown in FIGS. 2A, 2B, and 3, it is possible to optically change a pitch or a direction of patterns formed on the exposure plane. That is, the two Si substrates 2a, 2b are respectively independently rotated about the optical axis of electron beams, whereby it is possible to continuously change the pitch of patterns on the resist exposure plane on a surface of the substrate (or workpiece) 5. Further, if the two silicon substrates 2a, 2b simultaneously or integrally rotate round the optical axis, it is possible to rotate the entire image of patterns emerged on the exposure plane in such a condition that the pitch of patterns is fixed.

Furthermore, in the above-mentioned embodiment, the gap between the silicon substrates 2a and 2b is 2 mm in FIG. 2B. However, under a condition that the electron beams diffracted by the upper silicon substrate 2a are emitted onto the lower silicon substrate 2b, the gap therebetween is not limited to a value of 2 mm as shown in FIG. 2B. In other words, if a space for a mechanism capable of rotating independently can be secured, it is preferable that the gap therebetween is shorter than 2 mm and as close as possible.

FIGS. 2A and 2B are described in the embodiment that the Si substrate is used. The thin films 2a, 2b for use in the present invention are not limited to specific matter such as Si etc. as described above. Accordingly, each single crystal thin film 2a, 2b may be a single element crystal or a compound crystal such as GaAs, and these two single crystal thin films 2a, 2b may be constituted by the same crystals or different crystals. When material constituting a single crystal is selected, it must be taken into consideration that the electron beams are hard to pass through higher density material. Further, a single crystal thin film 2a, 2b must be in the state of a single crystal at room temperature or in the vicinity of room temperature, and it is preferable that the crystal is a perfect crystal or a crystal of high quality having lower crystal defects such as dislocations.

However, taking into consideration mechanical strength when forming a thin film of about 10 nm as shown in FIG. 2B, or facilitation in processing grooves for arranging the bearing sphere 201, or the like, a Si single crystal is considered to be most preferable in the existing condition.

Next, an exposing method using the electron-beam lithography system according to the first embodiment of the present invention as shown in FIG. 1 will be described. Electron beam 101 emitted from the electron-beam source is adjusted and shaped to be circular electron beam 1 via a shaping aperture 102, and circular beam 1 is directed towards the two Si substrates 2a, 2b, the relative angle θ between the two substrates is arranged so that as is equal to 60°. When the electron beam 1 passes through the Si substrates 2a, 2b, the electron beam 1 is divided into transmitted electron waves (transmitted electron beams) 1a and diffracted electron waves (diffracted electron beams) 1b diffracted by the Si substrate 2a and further by the Si substrate 2b. These electron waves 1a, 1b are focused on the back focal plane of the electron lens 3 by the electron lens 3. A position of the select aperture 4 corresponds to the back focal plane in FIG. 1. This back focal plane corresponds to the exposure plane of the electron-beam resist in the conventional electron-beam lithography system. The exposure plane on the surface of the substrate 5 in the present invention is apparently arranged lower than the position of the exposure plane of the conventional electron-beam lithography system.

Thereafter, the electron waves 1a, 1b mutually interfere and are projected onto the exposure plane (image plane) on the surface of the substrate 5 to form fringe patterns 6 inside an exposed circular region as shown in FIG. 1. As describe above, as the interplanar spacing d=d1=d2=0.314 nm of the Si (111) lattice plane is used in the present invention, in the case where the magnifying power M is equal to 10, the pitch D of fringe patterns is equal to 3.14 nm according to the formula (3) when θ is equal to 60°. The ratio of a line width (line) L of this fringe pattern to an interval (space) S between lines is decided according to the sensitivity of the electron-beam resist and the incident beam current density of the electron beams, or dosages. Accordingly, in a positive resist such as polymethylmethacrylate (PMMA) or polybutensulfone (PBS) etc., when the sensitivity of the electron-beam resist becomes higher relative to the incident beam current density, the line width L is finer.

That is, since the spacing D of fringe patterns produced on the exposing plane of the surface of the substrate 5 is determined by the formula (3), a focal distance f of the electron lens 3 dicides the magnifying power M, the spacings d1, d2 of lattice planes of the respective single crystal thin films 2a, 2b, and the relative rotation angle θ orienting these single crystal thin films 2a, 2b. These values may be selected such that the drawing of a line-and-space pattern having a pitch D in the accuracy of several-nanometers, namely nanometer-order, can be freely obtained.

Furthermore, the iris 4 as shown in FIG. 1 is provided between the electron lens 3 and the substrate 5 in order to select a predetermined diffracted wave from among the plurality of electron waves focused by the electron lens 3. That is, since the electron waves diffracted by the Si substrates 2a, 2b include the diffracted waves caused by other crystal lattice planes such as the (220) plane, in addition to the desired (111) plane, there are some possibilities that, in the course of mutual interference of the electron waves from the back focal plane of the electron lens 3 to the exposing plane 5, other fringe patterns along plural directions may occur. Accordingly, by use of the select aperture 4 having a several µm to 10 µm diameter hole, only the desired diffracted wave out of the plural diffracted waves focused by the electron lens 3 passes therethrough while the other diffracted waves are prevented from passing therethrough, whereby it is possible to obtain fringe patterns 6 only along a desired direction on the exposure plane.

The thus-obtained fringe pattern images 6 are irradiated to the electron-beam resist spin-coated on the surface of the substrate 5 to expose the electron-beam resist to cause a reaction involving the chain scission, so that drawing of the fringe patterns can be achieved.

Here, the Si substrates 2a, 2b are respectively independently rotated about the optical axis 7, so that the pitch D of patterns on the exposure plane can continuously be changed. Further, if the two Si substrates 2a, 2b are simultaneously or integrally rotated about the optical axis 7, it is possible to rotate the entire image of the fringe patterns 6 emerged on the exposure plane while fixing the pitch D of patterns. That is, each of the Si substrates 2a, 2b is independently or integrally rotated as described above, whereby it is possible to draw fringe patterns having a desired pitch in an optical direction on the exposure plane of the electron-beam resist. Thus, the workpiece throughput of electron-beam drawing can considerably be enhanced.

Accordingly, when the electron-beam lithography system and the drawing method using this electron-beam lithography system according to this embodiment are applied to a lithography technique for forming patterns of a semiconductor device such as LSIs etc., it becomes possible to manufacture giant scale LSIs or gigascale integration (GSI) such as 16 Gb DRAM, 64 Gb DRAM, or the like having a dimension of 0.1 µm or less, which could not be manufactured in the prior art. Further, it becomes possible to manufacture discrete devices such as three-dimensional superlattice and quantum devices etc., or various mesoscopic scale devices such as the ballistic transistor for amplifiers or oscillators in terahertz band optical communication systems etc.

In manufacturing quantum wires having dimensions less than 10 nm, or two-dimensional superlattice devices etc., a technique is being presently employed wherein an ultrathin multilayer structure having a molecule-layer-order dimension in a thickness direction is prepared by using a MBE or a MLE method etc., to obtain the lateral defined microstructures. Namely, in this case, V-groove-shaped minute stripes are formed by anisotropic etching for obtaining planar defined patterns and complicated steps of preparing nanometer-order patterns by using a periodic array of atomic steps must be carried out. However, planar stripe patterns on a mesoscopic scale can directly be obtained in the present invention and the quantum wires can readily be manufactured and the product yield becomes high.

Furthermore, since the fringe patterns 6 can be rotated easily by the rotation of the Si substrates 2a, 2b as shown in FIGS. 2 and 3, if the fringe patterns 6 are exposed twice in a right-angle (90°) direction. rectangular patterns can be formed. By changing the strength of electron beams, or the dosages in the first exposure and second exposure, oblong patterns can be formed. In this connection, when such two-time exposure in a right-angle direction is carried out, the employment of an oxide film mask is preferable. In other words, firstly the electron-beam resist is spin-coated onto an oxide film formed on the semiconductor substrate, such as GaAs having an ultrathin multilayer structure to form stripe patterns on the resist by an initial exposure, and the oxide film is etched by RIE or ECR ion etching with the use of the resist mask thus patterned to first form nanometer stripe patterns of oxide film in a predetermined direction. Next, after this resist is removed, another electron-beam resist is further formed on the oxide film being thus stripely patterned, and the second exposure in the 90° direction may be carried out. Thus, a quantum box such as three-dimensional superlattice devices etc. can readily be manufactured.

Furthermore, as represented by formula (3), since parameters deciding the spacing (pitch) D of fringe patterns do not contain an acceleration voltage of electron beams, even if a change in the acceleration voltage of electron beams occurs, the drawing position in the first embodiment of the present invention does not move and stable electron-beam lithography can be achieved.

In this connection, FIG. 1 describes a case where the two Si substrates are used as a thin film of a single crystal. The number of single crystal thin films is not limited to two, but the Si substrate can also be used with three thin films or more.

Figure 4:
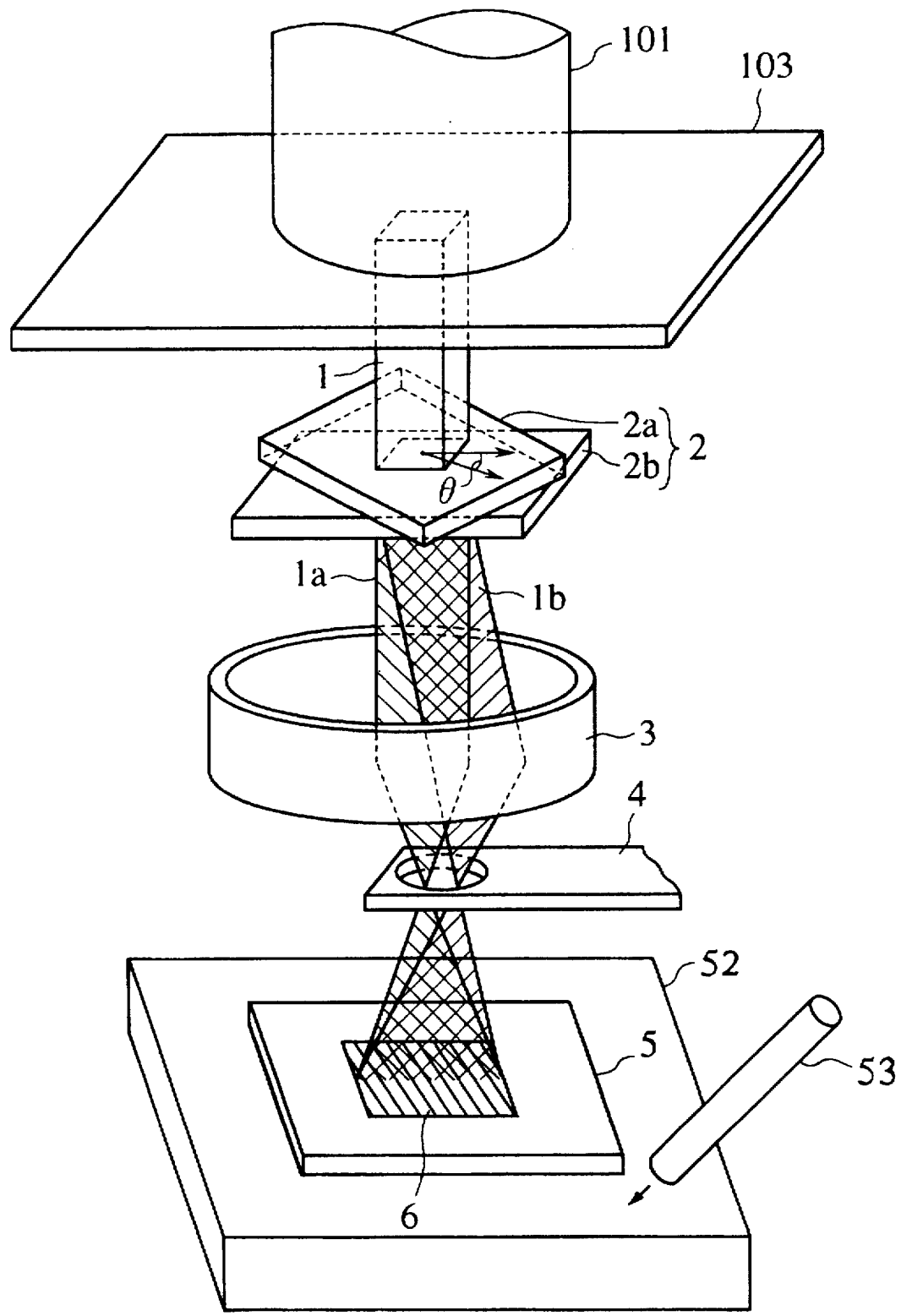
FIG. 4 is a schematic view showing a constitution of the electron beam lithography system according to a second embodiment of the present invention.

FIG. 4 is a schematic view showing the main portion of the electron-beam lithography apparatus according to a second embodiment of the present invention, having substantially the same configuration as FIG. 1. The difference is that a shaping aperture having a rectangular window for making a rectangular shaped beam 101 derived from the beam 101 emitted by the electron gun is used. That is, the electron-beam lithography system of FIG. 4 has main constitutional elements of an electron gun; a shaping aperture 103; Si substrates 2a, 2b; electron lens 3; and a select aperture 4. Fringe patterns 6 are formed on electron-beam resist on a surface of a workpiece, or a substrate 5 placed on an X-Y stage 52.

The second embodiment of the present invention differs from FIG. 1 in forming the fringe patterns 6 inside a rectangular region as shown in FIG. 4. If rectangular beams 1 adjusted by the aperture 103 further pass through another rectangular shaping aperture in FIG. 4, this embodiment is transformed into a variable shaped beam type electron-beam exposing machine, so that segment drawing can be performed.

The substrate 5 of FIG. 4 is placed on the X-Y stage that can be position-controlled by an optical interferometer. The precision with which the interferometer positions the X-Y manipulating stage 52 depends on the number of readable wavelength divisions of the interferometer light source. The interferometer light source may be a He:Ne laser (633 nm), or an infrared laser diode. A position-control system capable of reading 1/128th of this value (5 nm) is available. In this connection, when an electron-beam reticle such as a photoelectric plane mask, a hollow self-supporting mask, or the like is used instead of the shaping aperture 103 having a single window, an electron flood exposure or a step and repeat exposure can be carried out.

As explained above, the electron-beam lithography system according to the second embodiment of the present invention takes the electron beams as a wave and makes use of the interference effect called electron holography, and passes the electron beam emitted from the electron-beam source through the two Si substrates 2a, 2b and forms diffracted electron waves 1b and transmitted electron waves 1a, which can be focused by focusing means to mutually interfere to perform the drawing of patterns. Accordingly, if the spacings d1, d2 of lattice planes, or the relative rotation angle θ of the Si substrates 2a, 2b and the magnifying power M of an electron optics system etc. are suitably selected, patterns having a desired nanometer-order pitch can be obtained inside a rectangular beam exposed region of a variable dimension.

Specifically, the Si substrates 2a, 2b are respectively independently rotated round an optical axis of the electron beam emitted from the electron-beam source, so that the pitch of patterns can continuously be changed. Also, the two Si substrates 2a, 2b are integrally rotated round the optical axis, so that the entire image of patterns can be rotated to be drawn in an optical direction. A second exposure is carried out in a direction perpendicular to the initial-exposed fringe patterns, whereby it is possible to obtain square or rectangular patterns having a nanometer-order dimension in each edge. Further, if the two-time exposures are carried out so as to cross at an angle other than 90°, parallelogram patterns of a nanometer-order dimension can be obtained.

Figure 5:
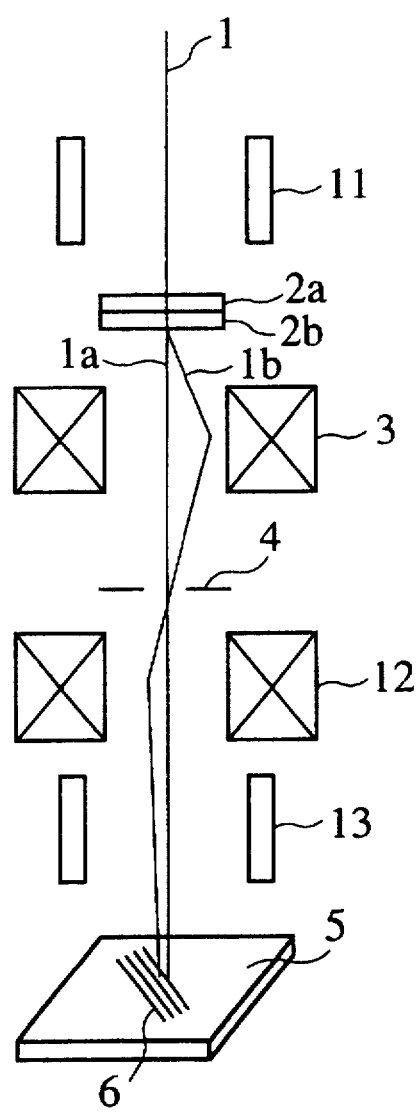
FIG. 5 is a schematic view showing a constitution of the electron beam lithography system according to a third embodiment of the present invention.

Next, a third embodiment of the present invention will be explained with reference to FIG. 5. Elements or members in the third embodiment are assigned the same reference numerals as used in the first and second embodiments and their descriptions are omitted. In the third embodiment of the present invention, a deflecting coil 11 (first deflecting means) for deflecting the electron beam from the electron-beam source to the electronic lens 3 is provided between the electron gun and the electron lens 3, and in particular between the electron gun (electron-beam source) and the two single crystal thin films 2a, 2b.

As for this deflecting coil 11, two coils, four coils, or eight coils can be provided opposing each other in the periphery of the electron beam 1 with the use of their optical axis as a center.

By this deflecting coil 11, the electron beam directed from the electron-beam source to the electronic lens 3 can be readily shifted towards a center of the optical axis of electronic lens 3. Thus, it is possible to reduce the influence of an aberration of the electron lens 3 and to enhance image quality of the fringe patterns 6 on the resist exposure plane formed on the surface of the substrate 5.

Furthermore, when the electron beams are mutually interfering after being focused by the electronic lens 3, an objective lens 12 focuses and forms an image towards the resist exposure plane, and such lens 12 is provided between the electron lens 3 and resist exposure plane, in particular between the select aperture 4 and resist exposure plane.

A magnifying power of this objective lens 12 is changed, whereby the spacing D of the fringe patterns 6 on the resist exposure plane can be changed freely based on the formula (5).

Furthermore, a deflecting coil 13 (second deflecting means) for deflecting the electron beams directed from the electronic lens 3 to the exposure plane 5 is provided between the electronic lens 3 and exposure plane 5, in particular between the objective lens 12 and exposure plane 5. This deflecting coil 13 is arranged in the periphery of the electron beams in the same manner as the deflecting coil 11.

By this deflecting coil 13, a position of the fringe patterns 6 on the exposure plane 5 can collectively be changed. Thus, a product throughout the electron-beam drawing can be still more enhanced.

What is claimed is:

1. An electron beam lithography system, comprising:
   a) an electron beam source for emitting a first electron beam;
   b) at least two single crystal thin films for receiving and diffracting said first electron beam, thereby producing an undiffracted electron beam and a diffracted electron beam; and
   c) focusing means for focusing both of said diffracted electron beam and said undiffracted electron beam such that said diffracted and undiffracted electron beams mutually interfere to produce a fringe pattern.

2. A system as claimed in claim 1, further comprising a shaping aperture between said electron beam source and said single crystal thin films for shaping said first electron beam into a predetermined shape.

3. A system as claimed in claim 2, wherein a pattern corresponding to a geometrical shape of the shaping aperture is reduction-projected on an exposure plane disposed at a different plane from a back focal plane defined by said focusing means.

4. A system as claimed in claim 1, further comprising a substrate pedestal for holding a substrate, such that said fringe pattern is projected on a resist film coated on the substrate.

5. A system as claimed in claim 4, wherein said substrate pedestal is mounted on an X-Y manipulating stage provided with an optical interferometer for detecting and controlling the position of the stage.

6. A system as claimed in claim 1, further comprising rotating means for rotating each of said two single crystal thin films in either one of an independent and an integral manner.

7. A system as claimed in claim 1, wherein said two single crystal thin films are separated by a gap.

8. A system as claimed in claim 1, wherein said interference fringe pattern comprises stripes having a spacing D therebetween.

9. A system as claimed in claim 8, wherein said spacing D is given by the formula:

$$D = M \cdot d_1 \cdot d_2 / \sqrt{(d_1^2 + d_2^2 - 2d_1 d_2 \cdot \cos\theta)},$$

where M is a magnifying power of the system, $d_1$ is an interplanar spacing of a first of said two single crystal thin films, $d_2$ is an interplanar spacing of a second of said two single crystal thin films, and $\theta$ is a rotational angle about an optical axis of the system measured between said two single crystal thin films.

10. An electron beam lithography system, comprising:
   a) an electron-beam source for emitting a first electron beam;
   b) at least two single crystal thin films for receiving and diffracting said first electron beam, thereby producing an undiffracted electron beam and plural diffracted electron beams;
   c) focusing means for focusing both of said undiffracted electron beam and said diffracted electron beams such that said undiffracted electron beam and said diffracted electron beams mutually interfere; and
   d) selecting means for selecting only a desired diffracted electron beam from among said plural diffracted electron beams.

11. A system as claimed in claim 10, wherein said selecting means is a select aperture having a hole of a diameter 1 to 10 μm.

12. A system as claimed in claim 10, wherein said selecting means is disposed at a position of a back focal plane defined by said focusing means.

13. An electron beam lithography system, comprising:
   a) an electron beam source for emitting a first electron beam;
   b) a first deflecting means for deflecting said first electron beam;
   c) at least two single crystal thin films for receiving and diffracting said first electron beam, thereby producing an undiffracted electron beam and plural diffracted electron beams;
   d) a first focusing means for focusing both of said undiffracted electron beam and said diffracted electron beams;
   e) selecting means for selecting only a desired diffracted electron beam from among said plural diffracted electron beams;
   f) a second focusing means for focusing said undiffracted electron beam and said desired diffracted electron beam such that said undiffracted electron beam and said desired diffracted electron beam mutually interfere to produce a fringe pattern; and
   g) a second deflecting means for deflecting said undiffracted and desired diffracted electron beams focused by said second focusing means.

14. A system as claimed in claim 13, wherein at least one of said first and second focusing means is an electron lens.

15. A system as claimed in claim 13, wherein said selecting means is disposed at a position of a back focal plane defined by said first focusing means.

16. An electron-beam lithography method for drawing a nanometer-order pattern, comprising:
   providing a coating of an electron beam resist on a substrate;
   b) irradiating a first electron beam through at least two single crystal thin films to produce an undiffracted electron beam and a diffracted electron beam;
   c) interfering said undiffracted electron beam and said diffracted electron beam, thereby producing an interference fringe pattern; and
   d) projecting said interference fringe pattern onto said electron beam resist coated substrate, such that the electron beam resist is exposed.

17. A method as claimed in claim 16, further comprising passing said first electron beam through a shaping aperture having a specific opening pattern, such that said first electron beam is adjusted so as to have a specific beam shape prior to said step b).

18. A method as claimed in claim 16, further comprising rotating independently each of said two single crystal thin films prior to said step b) such that a pitch of said interference fringe pattern is changed.

19. A method as claimed in claim 16, further comprising integrally rotating said at least two single crystal thin films about a predetermined axis prior to said step b) such that a direction of said fringe pattern on said electron beam resist is rotated.

20. A method as claimed in claim 16, further comprising mounting said substrate to an X-Y manipulating stage which is movable in accordance with an output signal of an optical interferometer provided to said stage after said step a), such that a step and repeat exposure is carried out.

21. A method for producing a nanometer-order pattern, comprising:
   a) providing a coating of an electron beam resist on a substrate;
   b) exposing said electron beam resist a first time by irradiating a first electron beam through at least two single crystal thin films to produce an undiffracted electron beam and a diffracted electron beam, interfering said undiffracted electron beam and said diffracted electron beam, thereby producing an interference fringe pattern, and projecting said interference fringe pattern onto said electron beam resist coated substrate using an irradiation dosage which is less than a dosage required to cause a perfect chain scission of said electron beam resist;
   c) integrally rotating said at least two single crystal thin films about a predetermined axis; and
   d) exposing said electron beam resist a second time by irradiating a first electron beam through at least two single crystal thin films to produce an undiffracted electron beam and a diffracted electron beam, interfering said undiffracted electron beam and said diffracted electron beam, thereby producing an interference fringe pattern, and projecting said interference fringe pattern onto said electron beam resist coated substrate using an irradiation dosage which is sufficient to cause a perfect chain scission of said electron beam resist such that a pattern having a nanometer-order dimension and having one of a rectangular and a parallelogram shape is obtained.

22. A method for drawing a nanometer-order pattern, comprising the steps of:
   a) forming an oxide film on a substrate;
   b) coating a first electron beam resist on the oxide film;
   c) exposing said first electron beam resist by irradiating a first electron beam through at least two single crystal thin films to produce an undiffracted electron beam and a diffracted electron beam, interfering said undiffracted electron beam and said diffracted electron beam, thereby producing a first interference fringe pattern arranged along a first direction, and projecting said first interference fringe pattern onto said first electron beam resist to produce a first striped pattern in said first electron beam resist;
   d) etching of said oxide film using said first electron beam resist as a mask;
   e) removing said first electron beam resist;
   f) coating a second electron beam resist on said oxide film;
   g) integrally rotating said at least two single crystal thin films about a predetermined axis;
   h) exposing said second electron beam resist by irradiating a first electron beam through at least two single crystal thin films to produce an undiffracted electron beam and a diffracted electron beam, interfering said undiffracted electron beam and said diffracted electron beam, thereby producing a second interference fringe pattern arranged along a second direction, and projecting said second interference fringe pattern onto said second electron beam resist to produce a second striped pattern in said second electron beam resist;
   l) etching said oxide film using said second electron beam resist as a mask; and
   j) removing said second electron beam resist, thereby leaving a pattern in said oxide film having a nanometer-order dimension and one of a rectangular and a parallelogram shape.

* * * * *